United States Patent [19]
Jalby et al.

[11] Patent Number: 5,055,246
[45] Date of Patent: Oct. 8, 1991

[54] METHOD OF FORMING HIGH PURITY METAL SILICIDES TARGETS FOR SPUTTERING

[75] Inventors: Pierre Jalby, La Marne, France; Pierre Claverie, Boulogne, France; Frédéric Rotman, Paris, France; Masao Kimura, Tsuchiura, Japan; Jean-Marie Friedt, Shinjuku, Japan; Juichi Arai, Ibaraki Pref., Japan

[73] Assignee: L'Air Liquide, Societe Anonyme pour l'Etude et L'Exploitation des Procedes Georges Claude, Paris, France

[21] Appl. No.: 643,490

[22] Filed: Jan. 22, 1991

[51] Int. Cl.$^5$ .................... C23C 16/42; C23C 14/40; C23C 14/16
[52] U.S. Cl. .................... 264/81; 427/255.2; 204/192.17; 204/298.12; 204/298.13
[58] Field of Search .................... 427/255.2; 264/81; 204/298.12, 298.13, 192.17

[56] References Cited

U.S. PATENT DOCUMENTS

| | | | |
|---|---|---|---|
| 4,750,932 | 6/1988 | Parent et al. | 204/298.13 |
| 4,851,295 | 7/1989 | Brors | 427/255.2 |
| 4,938,798 | 7/1990 | Chiba et al. | 204/298.13 |

FOREIGN PATENT DOCUMENTS 62-060864 3/1987 Japan.
63-227771 9/1988 Japan.
01-039374 2/1989 Japan.

Primary Examiner—Shrive Beck
Assistant Examiner—Margaret Burke
Attorney, Agent, or Firm—Oblon, Spivak, McClelland, Maier & Neustadt

[57] ABSTRACT

The invention relates to a process of making a high purity silicide target comprising the steps of providing a substrate in a CVD enclosure, evacuating said enclosure up to a pressure P1 which is at least equal to or smaller than $5 \times 10^{-5}$ Torr, heating the substrate at a temperature T1, which is at least equal to or greater than 20° C., injecting in said enclosure a refractory metal halide MXm having a purity, as far as metallic impurities are concerned, greater than 5N (99,999%) and a silicon hydride having a purity, as far as metallic impurities are concerned, greater than 6N (99,9999%) setting the pressure in the enclosure between about 0.01 Torr and the atmospheric pressure while maintaining the temperature in the CVD enclosure between about 20° C., growing a refractory metal silicide layer on the substrate to make a target having a purity, as far as metallic impurities are concerned, greater than 5N (99,99%), maintaining the temperature in the enclosure during said growing step at a value T2 which is not greater than T1, then withdrawing the target from said CVD enclosure.

12 Claims, 1 Drawing Sheet

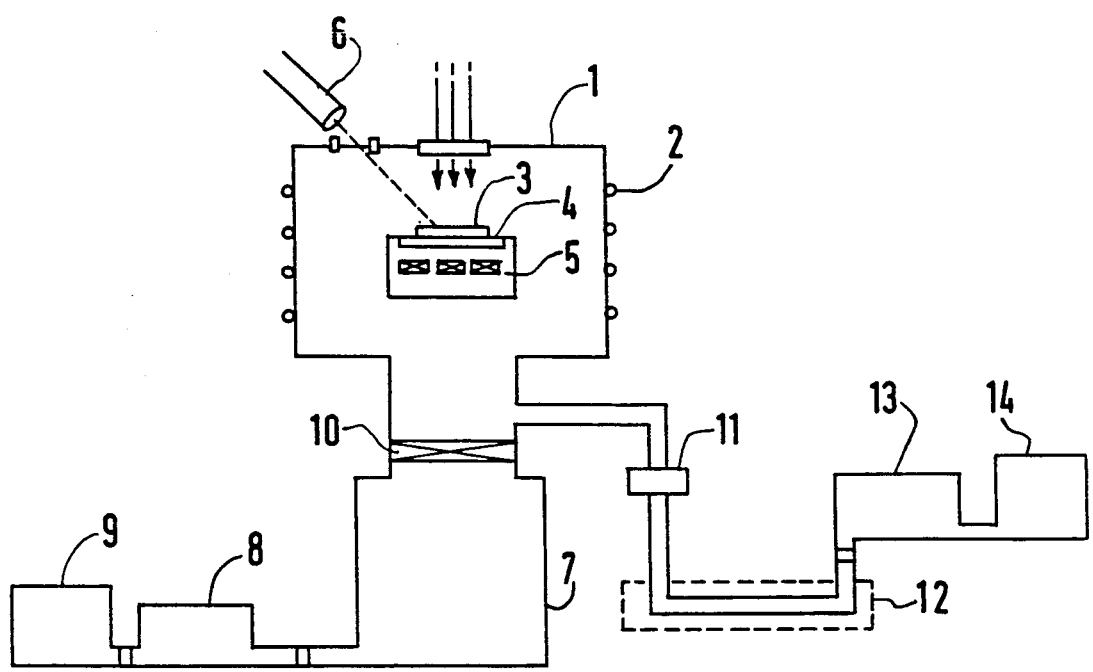

METHOD OF FORMING HIGH PURITY METAL SILICIDES TARGETS FOR SPUTTERING

BACKGROUND OF THE INVENTION

1. Field of the Invention

This invention relates to a method of forming high purity metal silicide targets such as WSiz, MoSiz, TiSiz, TaSi) used for sputtering, wherein $0,5 < z < 3$.

2. Description of the Prior Art

Metal silicides have received attention for applications in VLSI circuits. These materials are attractive for gate metallization of Silicon based devices because their resistivities are an order of magnitude lower than those of conventional materials used for interconnection, such as alumina.

It is known from the article of C. G. SRIDHAR et al entitled "Characterization of Tungsten Silicide films deposited from ultrahigh density composite target", proceeding of the 1985 workshop "Tungsten and other refractory metals for VLSI applications"—Materials Research Society—p. 267-280—to obtain metal silicide films with a sputtering technique.

In order to improve the sputtering technique, the quality of the targets remains a key factor : a high purity target is required to obtain a pure silicide film on the substrate. Especially, it is known that the impurity levels of radioactive elements such as Uranium and Thorium which can emit Alpha-particles, and alkalis metals (Na,K) must be very low.

It is also known from the article of M. SUZUKI entitled "Development of refractory metal and silicide targets and their characteristics" Proceeding of the 1986 Workshop "Tungsten and other refractory metals for VLSI application II", 1986—Materials Research Society—p. 339-345, to make metal silicide targets (MSix) used for sputtering by mixing and sintering a metal (M) powder and a silicon powder.

As the purity is an essential property expected from these targets, a very complex and long chemical process is used in order to purify the raw materials:

At first, the raw materials are dissolved in acidic solution. Afterwards, crystallization and drying steps are carried out, the metal oxyde thus obtained being generally reduced by hydrogen in order to produce a metal powder, which is subsequently chemically refined, mixed with a Silicon powder, and then sintered at high temperature. Finally a machining step is often necessary to obtain the metal silicide target having an appropriate shape. Moreover, in addition to the complexity of this process, several other problems are encountered which means several drawbacks:

- Since numerous steps are necessary to make said target, contamination by the surrounding environment cannot be avoided and the purity rarely overcomes more than four nines, i.e. 99,99% of metal purity based only on metal impurities.
- The sintering step of these refractory materials MSix is carried out at a temperature which is usually greater than 1500° C.
- The cost of the overall process is high because there are several different steps which are time and/or energy consuming.

SUMMARY OF THE INVENTION

It is an object of this invention to provide a process to make a high purity silicide target by Chemical Vapor Deposition, wherein said target can be made continuously and quickly with an improved purity.

According to the invention, it is provided a process of making a high purity silicide target comprising the steps of providing a substrate in a CVD enclosure, evacuating said enclosure up to a pressure P1 which is at least equal to or smaller than $5 \times 10^{-5}$ Torr, heating the substrate at a temperature T1, which is at least equal to or greater than 20° C., injecting in said enclosure a refractory metal halide MXm having a purity, as far as metallic impurities are concerned, greater than 5N (99,999%) and a silicon hydride having a purity, as far as metallic impurities are concerned, greater than 6N (99,9999%) setting the pressure in the enclosure between about 0.01 Torr and the atmospheric pressure while maintaining the temperature in the CVD enclosure between about 20° C. and about 800° C., growing a refractory metal silicide layer on the substrate to make a target having a purity, as far as metallic impurities are concerned, greater than 5N (99,999%), maintaining the temperature in the enclosure during said growing step at a value T2 which is not greater than T1, then withdrawing the target from said CVD enclosure.

According to a preferred embodiment of the invention and in order to shorten the degassing step of the substrate and enclosure (evacuation and heating) which is always necessary before starting the gas injection, the process comprises, after providing the substrate in the enclosure, a step of evacuating the enclosure at a pressure P2 smaller than P1 while heating the substrate at a temperature $T2 > T1$.

The reaction temperature in the CVD enclosure is selected between about 20° C. and about 800° C., according to the nature of the gases used in the process.

The substrate shall be preferably a material which is stable under pressure and temperature conditions in the CVD enclosure and which can be separated, removed or dissolved according to the operator's choice, such as copper and its alloys.

The ratio of flowrates of silicon hydride to metal halide is selected between 1 and 25.

The metal silicide formed in accordance with the method of the present invention has the chemical formula $MSi_z$ (M indicates the metal, the molar ratio "z" of Si to M varies from 3 to 0.5).

The metal of the target is preferably selected from the group comprising Tungsten, Molybdenum, Titanium and Tantalum.

The metal halide gas may be a fluoride gas or a chloride gas, such as $WF_6$, $MoF_6$, $TaF_5$, $TiF_4$, or $WCl_6$, $MoCl_6$, $TaCl_5$ and $TiCl_4$.

The Silicon hydride gas is a gas having the chemical formula $Si_nH_{2n+2}$ (n=1, 2, 3 ... ), preferably $SiH_4$.

When the hydride gas is silane $SiH_4$ and the metal halide gas is $WF_6$ or $MoF_6$, the preferable conditions are the following:

- the ratio of flowrates $SiH_4/MF_6$ is greater than about 3.
- the temperature deposition is preferably set between about 200° C. and 600° C.

The silicide target thus formed is substantially amorphous, which is a necessary condition of a good sputtering target.

The main advantages of the method described in the present invention, compared to the sintered powder process are the following:

high purity of the target of the invention compared to the targets obtained according to the teaching of Suzuki.

one step process (continuous).

low temperature process (less than 800° C. instead of at least 1500° C.).

adjustable composition process: the stoechiometry of the formed silicide can be very precisely adjusted as a function of injected gas flow rates, including a modification of the flow rates during the process if the z number (MSiz) has to be modified.

BRIEF DESCRIPTION OF THE DRAWINGS

FIG. 1 is an example of CVD system which can be used for the present invention.

FIG. 1 shows the CVD system to carry out the present invention. It consists of a gas distribution system, the cold wall type chamber, the heating system, and the pumping system. The available gases are $SiH_4$, $WF_6$ He, Ar and $H_2$ in this case. (but also $MoF_6$, $WCl_6$, $MoCl_6$, $TaF_5$, $TaCl_5$, $TiCl_4$, $TiF_4$ can be used).

Helium (He) is used as a carrier gas for metal halides. Argon is used to purge the chamber after the deposition is completed.

The chamber (1) is a cold wall type water cooled (2) reactor made in stainless steel. A copper foil substrate (3), for example, is set on a quartz glass plate (4) under which is a radiant heater (5) with three infrared lamps, positioned in the middle of the chamber.

The substrate temperature is measured by an infrared pyrometer (6). The chamber is evacuated by a turbomolecular pump (7), which is backed by one master booster pump (8) and a rotary pump (9). A pressure base around $10^{-6}$ Torr can be easily reached.

A gate valve (10) isolates the chamber from the turbomolecular pump. In addition a second pumping line bypassing the gate valve and containing a butterfly pressure controlling valve (11), a trap for detoxification (12), a master booster pump (13) and a rotary pump (14) is operated during deposition.

EXAMPLE 1

At first, the CVD enclosure is evacuated and then the substrate is slowly heated up to 500° C., a temperature higher than the temperature used there after for the deposition.

When the pressure base is reached, typically lower than $5.10^{-5}$ Torr, the pumping line is exchanged for that used for deposition. In this example 1 here described, a Tungsten silicide $WSi_x$ deposition occurs. After the stabilization of the substrate temperature used for deposition (250° C.) gases $SiH_4$, $WF_6$ and He are injected with a ratio $SiH_4/WF_6=4$, under the following flow rates:

$SiH_4$ : 30 sccm
$WF_6$ : 7,5 sccm
He : 64 sccm

The deposition time is 2 hours and 30 minutes. The pressure inside the chamber is set at 0.2 Torr and the temperature is 250° C. After the deposition is completed several purges are carried out with Ar gas. Afterward, the copper foil is dissolved in acids, and then characterization can be carried out.

It consists in a Scanning Electronic Microscope (SEM) analysis in order to determine the thickness of the layer by cross section views, and in a quantitative analysis in order to get the impurity levels.

In this example, measured thickness is 227 microns, which are obtained in 150 minutes, that is to say a deposition rate of 1.5 micron/min.

An X-Ray diffraction measurement shows that the product is amorphous.

The metal purity reaches 6N (99.9999%). The amount of radioactive elements (U, Th) and Alkalis metals (K, Na) are under 10 ppb.

The amount of others metals (Cr, Ni, Cu, Fe, Al . . . ) remains under 1 ppm.

The oxygen content is lower than 200 ppm, which is a better value than the usual ones obtained by sintering processes.

These values are those usually requested for those kind of targets.

EXAMPLE 2

This second example describes the way to obtain a molybdenum silicide target.

The apparatus is one type of reactor which can be used for the present invention, the same that in example 1. In the same way, a copper foil substrate is set in the reactor.

The CVD enclosure is evacuated while the substrate is heated at 600° C. When the pressure base is reached, the pumping line is exchanged for that used for deposition. After the stabilization of the deposition temperature, 400° C., gases were injected with contents as follows:

10 sccm of $MoF_6$
100 sccm of $SiH_4$
64 sccm of He

Deposition time in this example is 3 hours. The pressure inside the chamber is set at 0.2 Torr. The ratio $SiH_4/MoF_6$ is in this case 10.

A qualitative analysis with a X-Ray analyse coupled with the SEM is carried out. Referring to FIG. 2, there is formation of a molybdenum silicide $MoSi_z$.

A X-Ray diffraction measurement shows that the product is amorphous.

720 microns are obtained in 3 hours, that is to say a deposition rate around 4 micron/min.

The metal purity reaches 6N (99.9999%). Radioactive elements and alkalis contents do not exceed 100 ppb and other metals amounts are under 1 ppm. The oxygene content is also, in this case, lower than 200 ppm.

We claim:

1. A method to manufacture a high purity silicide target comprising the steps of providing a substrate in a CVD enclosure, evacuating said enclosure up to a pressure P1 which is at least equal to or smaller than $5 \times 10^{-5}$ Torr, heating the substrate at a temperature T1, which is at least equal to or greater than 20° C., injecting in said enclosure a refractory metal halide MXm having a purity, as far as metallic impurities are concerned, greater than 5N (99,999%) and a silicon hydride having a purity, as far as metallic impurities are concerned, greater than 6N (99,9999%) setting the pressure in the enclosure between about 0.01 Torr and the atmospheric pressure while maintaining the temperature in the CVD enclosure between about 20° C. and about 800° C., growing a refractory metal silicide layer on the substrate to make a target having a purity, as far as metallic impurities are concerned, greater than 5N (99,999%), maintaining the temperature in the enclosure during said growing step at a value T2 which is not greater than T1, then withdrawing the target from said CVD enclosure.

2. A method according to claim 1, further comprising the steps of, after providing the substrate in the enclosure, evacuating the enclosure at a pressure P2<P1 while heating the substrate at a temperature T2>T1.

3. A method according to claim 1, wherein the substrate is separated from the refractory metal silicide layer.

4. A method according to claim 1, wherein the metal of said metal silicide is selected from the group consisting of Tungsten, Molybdenum, Tantalum and Titanium.

5. A method according to claim 1, wherein said metal halide gas is a fluoride metal gas.

6. A method according to claim 5, wherein said fluoride gas is selected from the group consisting of $WF_6$, $MoF_6$, $TaF_5$ and $TiF_4$.

7. A method according to claim 1, wherein said metal halide gas is a metal chloride gas.

8. A method according to claim 7, wherein said metal chloride gas is selected from the group consisting of $WCl_6$, $MoCl_6$, $TaCl_5$ and $TiCl_4$.

9. A method according to claim 1, wherein said Silicon hydride gas is a gas having the chemical formula: $Si_nH_{2n+2}$ with n=1,2,3.

10. A method according to claim 1, wherein said metal halide gas is $WF_6$ or $MoF_6$ gas, said Silicon Hydride gas is silane ($SiH_4$), and said temperature is at least 150° C.

11. A method according to claim 1, wherein the substrate is selected from the group consisting of copper and its alloys.

12. A method according to claim 11, where in said substrate is dissolved with an acidic medium after removal of the target from the enclosure.

* * * * *